(12) United States Patent
Moniruzzaman

(10) Patent No.: US 9,125,310 B2
(45) Date of Patent: Sep. 1, 2015

(54) ELECTROSTATIC DISSIPATIVE COMPOSITES

(75) Inventor: Mohammad Moniruzzaman, Exton, PA (US)

(73) Assignee: SABIC Global Technologies B.V., Bergen op Zoom (NL)

( * ) Notice: Subject to any disclaimer, the term of this patent is extended or adjusted under 35 U.S.C. 154(b) by 718 days.

(21) Appl. No.: 13/328,468

(22) Filed: Dec. 16, 2011

(65) Prior Publication Data

US 2013/0153832 A1 Jun. 20, 2013

(51) Int. Cl.
| | |
|---|---|
| *H01B 1/06* | (2006.01) |
| *H05K 1/03* | (2006.01) |
| *H01B 1/24* | (2006.01) |
| *H01L 23/29* | (2006.01) |
| *H05K 9/00* | (2006.01) |
| *H05K 1/02* | (2006.01) |

(52) U.S. Cl.
CPC ............. *H05K 1/0366* (2013.01); *H01B 1/24* (2013.01); *H01L 23/295* (2013.01); *H05K 9/0079* (2013.01); *H05K 1/0259* (2013.01); *H05K 2201/0154* (2013.01); *H05K 2201/0293* (2013.01)

(58) Field of Classification Search
None
See application file for complete search history.

(56) References Cited

U.S. PATENT DOCUMENTS

| | | | | |
|---|---|---|---|---|
| 4,049,613 A * | 9/1977 | White | ............................ | 524/495 |
| 4,579,902 A | 4/1986 | O'Brien | ........................ | 524/496 |
| 4,832,932 A | 5/1989 | Tada et al. | ................... | 423/447.2 |
| 5,571,859 A | 11/1996 | Yukishige et al. | ............. | 524/496 |
| 5,820,788 A | 10/1998 | Smith | ............................ | 252/511 |
| 6,103,818 A | 8/2000 | Morita et al. | .................. | 524/606 |
| 6,344,513 B1 | 2/2002 | Numata | ......................... | 524/496 |
| 6,375,863 B1 * | 4/2002 | Tachikawa et al. | ....... | 252/299.01 |
| 7,235,514 B2 * | 6/2007 | Mack et al. | .................... | 508/100 |
| 8,642,682 B2 | 2/2014 | Nishihata | | |
| 2005/0209391 A1 * | 9/2005 | Nakayama et al. | ............ | 524/496 |
| 2006/0035047 A1 | 2/2006 | Fujita et al. | ................. | 428/36.91 |
| 2007/0276081 A1 * | 11/2007 | Yuan | .............................. | 524/494 |
| 2008/0038517 A1 | 2/2008 | Nishihata et al. | ............. | 428/174 |
| 2011/0319525 A1 * | 12/2011 | Maeda et al. | .................. | 523/452 |

FOREIGN PATENT DOCUMENTS

| | | |
|---|---|---|
| CN | 1918220 A | 2/2007 |
| CN | 1950447 A | 4/2007 |
| CN | 101220204 | 7/2008 |
| FR | 2512076 | 3/1983 |

(Continued)

OTHER PUBLICATIONS

International Search Report issued Jun. 20, 2013 for PCT Application No. PCT/US2012/067734, which published as WO 2013090054 on Jun. 20, 2013 (Applicant—Sabic, Innovative Plastics IP BV // Inventor—Moniruzzaman) (6 pages).

(Continued)

*Primary Examiner* — Harold Pyon
*Assistant Examiner* — Jaison Thomas
(74) *Attorney, Agent, or Firm* — Baker & Hostetler LLP

(57) ABSTRACT

The present disclosure relates to thermoplastic electrostatic dissipative (ESD) composites. The disclosed composites comprise a thermoplastic resin phase and a plurality of intermediate modulus carbon fibers dispersed within the thermoplastic resin phase. Also disclosed herein are methods for the manufacture and/or use of the disclosed ESD composites as well as articles formed from such composites.

33 Claims, 2 Drawing Sheets

(56) References Cited

FOREIGN PATENT DOCUMENTS

| | | |
|---|---|---|
| FR | 2918309 | 1/2009 |
| GB | 2225785 | 6/1990 |
| JP | H07-166432 | 6/1995 |
| JP | 09-255872 | 9/1997 |
| JP | H10-045979 | 2/1998 |
| JP | 2005075914 | 3/2005 |
| JP | 2005187658 | 7/2005 |
| JP | 2007284561 | 11/2007 |
| WO | WO 00/32682 | 6/2000 |

OTHER PUBLICATIONS

"3M EMI Shielding Versus ESD Shielding", Technical Brief, Aug. 1982, 107, 2 pages.

Das et al., "Graphene-Based Polymer Composites and Their Applications", Polymer-Plastics Technology and Engineering, 2013, 52(4), 319-331.

Gulrez et al., "A Review on Electrically Conductive Polypropylene and Polyethylene", Polym. Compos., 2014, 35, 900-914.

* cited by examiner

ELECTROSTATIC DISSIPATIVE COMPOSITES

BACKGROUND OF THE INVENTION

Electrostatic dissipative materials are frequently used in sensitive electronic devices to reduce and/or prevent the accumulation of potentially dangerous charges. In, for example, the semiconductor and automotive industries, the accumulation of static charge can result in permanent damage to electronic components and can create hazardous conditions.

Conventional electrostatic dissipative materials utilize conductive fillers, such as, for example, carbon fiber, in a polymeric matrix to impart conductive properties. To be effective, electrostatic dissipative materials should have a surface resistivity between E6 and E9 ohm/sq. With conventional materials, the percolation curve (surface resistivity vs. filler loading) is steep, as illustrated in FIG. 1, resulting in a narrow range of filler concentration to achieve a desired surface resistivity. As such, small variations in the concentration and/or loading of the conductive filler can result in substantial, and potentially undesirable, changes in the material's electrostatic dissipative properties.

Accordingly, there remains a need for robust electrostatic dissipative materials that can provide desirable properties over a wider range of composition and processing conditions. This and other needs are satisfied by the various aspects of the present disclosure.

SUMMARY OF THE INVENTION

This invention relates generally to electrostatic dissipative composites and, more particularly to carbon fiber filled thermoplastic resin electrostatic dissipative composites. To that end, according to embodiments of the invention, electrostatic dissipative (ESD) composites are disclosed that generally comprise a thermoplastic polymer phase or matrix and a plurality of carbon fibers dispersed within the thermoplastic matrix. The carbon fibers have a tensile modulus in the range of from about 38 to 48 million pounds per square inch (MSI). According to these embodiment, the composite further exhibits a surface resistivity in the range of from $10^6$ ohms to $10^9$ ohms.

According to further embodiments, disclosed are electrostatic dissipative composites comprising a thermoplastic polymer phase or matrix and a plurality of carbon fibers dispersed within the thermoplastic matrix. The carbon fibers according to these embodiments have a tensile modulus in the range of from about 39 to 43 million pounds per square inch (MSI) and are present in the thermoplastic matrix in an amount in the range of from about 8 weight percent to about 16 weight percent relative to a total weight of the composite. Further, these composites also exhibit a surface resistivity in the range of from $10^6$ ohms to $10^9$ ohms.

In still further embodiments, a method is provided for the manufacture of the ESD composites described herein. The method generally comprises providing a thermoplastic resin; providing a plurality of carbon fibers having a tensile modulus in the range of from 38 to 48 million pounds per square inch (MSI) dispersed within the thermoplastic polymer matrix; and combining the plurality of carbon fibers and the thermoplastic resin to provide a composite mixture. According to some embodiments, the plurality of carbon fibers are present in the resultant mixture in an amount in the range of from about 8 weight percent to about 16 weight percent relative to a total weight of the mixture.

In still further embodiments, articles of manufactures comprising the disclosed ESD composites and methods for the use of such articles of manufacture are also provided.

Other advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate exemplary embodiments and together with the description, serve to explain the principles of the compositions, methods and systems disclosed herein.

DETAILED DESCRIPTION OF THE INVENTION

Figure 1:
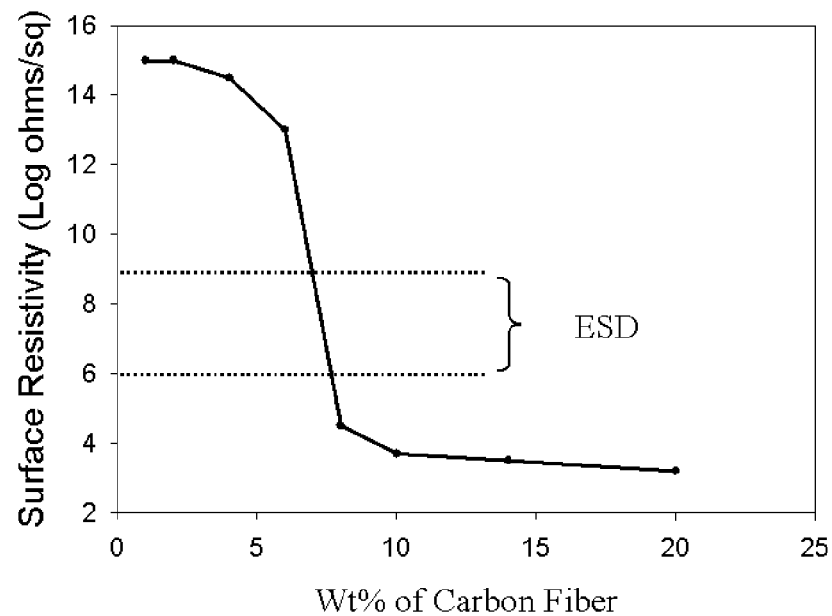
FIG. 1 is a graph illustration of a percolation curve representative of a conventional carbon fiber filled thermoplastic resin electrostatic dissipative composite.

The present invention can be understood more readily by reference to the following detailed description, examples, drawings, and claims, and their previous and following description. However, before the present compositions, articles, devices, systems, and/or methods are disclosed and described, it is to be understood that this invention is not limited to the specific compositions, articles, devices, systems, and/or methods disclosed unless otherwise specified, as such can, of course, vary. It is also to be understood that the terminology used herein is for the purpose of describing particular aspects only and is not intended to be limiting.

The following description of the invention is also provided as an enabling teaching of the invention in its best, currently known embodiment. To this end, those of ordinary skill in the relevant art will recognize and appreciate that changes and modifications can be made to the various aspects of the invention described herein, while still obtaining the beneficial results of the present invention. It will also be apparent that some of the desired benefits of the present invention can be obtained by selecting some of the features of the present invention without utilizing other features. Accordingly, those of ordinary skill in the relevant art will recognize that many modifications and adaptations to the present invention are possible and can even be desirable in certain circumstances and are thus also a part of the present invention. Thus, the following description is provided as illustrative of the principles of the present invention and not in limitation thereof.

Various combinations of elements of this disclosure are encompassed by this invention, e.g. combinations of elements from dependent claims that depend upon the same independent claim.

Moreover, it is to be understood that unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; and the number or type of embodiments described in the specification.

All publications mentioned herein are incorporated herein by reference to disclose and describe the methods and/or materials in connection with which the publications are cited.

It is also to be understood that the terminology used herein is for the purpose of describing particular aspects only and is not intended to be limiting. As used in the specification and in the claims, the term "comprising" may include the embodiments "consisting of" and "consisting essentially of." Unless defined otherwise, all technical and scientific terms used herein have the same meaning as commonly understood by one of ordinary skill in the art to which this invention belongs. In this specification and in the claims which follow, reference will be made to a number of terms which shall be defined herein.

As used in the specification and the appended claims, the singular forms "a," "an" and "the" include plural referents unless the context clearly dictates otherwise. Thus, for example, reference to "a carbon fiber" includes mixtures of two or more such carbon fibers. Furthermore, for example, reference to a filler includes mixtures of fillers.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "optional" or "optionally" mean that the subsequently described event, condition, component, or circumstance may or may not occur, and that the description includes instances where said event or circumstance occurs and instances where it does not.

As used herein, the term or phrase "effective," "effective amount," or "conditions effective to" refers to such amount or condition that is capable of performing the function or property for which an effective amount is expressed. As will be pointed out below, the exact amount or particular condition required will vary from one embodiment to another, depending on recognized variables such as the materials employed and the processing conditions observed. Thus, it is not always possible to specify an exact "effective amount" or "condition effective to." However, it should be understood that an appropriate effective amount will be readily determined by one of ordinary skill in the art using only routine experimentation.

Disclosed are the components to be used to prepare disclosed compositions of the invention as well as the compositions themselves to be used within methods disclosed herein. These and other materials are disclosed herein, and it is understood that when combinations, subsets, interactions, groups, etc. of these materials are disclosed that while specific reference of each various individual and collective combinations and permutation of these compounds can not be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the invention. Thus, if there are a variety of additional steps that can be performed it is understood that each of these additional steps can be performed with any specific aspect or combination of aspects of the methods of the invention.

References in the specification and concluding claims to parts by weight, of a particular element or component in a composition or article, denotes the weight relationship between the element or component and any other elements or components in the composition or article for which a part by weight is expressed. Thus, in a composition containing 2 parts by weight of component X and 5 parts by weight component Y, X and Y are present at a weight ratio of 2:5, and are present in such ratio regardless of whether additional components are contained in the compound.

A weight percent of a component, unless specifically stated to the contrary, is based on the total weight of the formulation or composition in which the component is included. For example if a particular element or component in a composition or article is said to have 8% weight, it is understood that this percentage is relation to a total compositional percentage of 100%.

Compounds are described using standard nomenclature. For example, any position not substituted by any indicated group is understood to have its valency filled by a bond as indicated, or a hydrogen atom. A dash ("-") that is not between two letters or symbols is used to indicate a point of attachment for a substituent. For example, —CHO is attached through carbon of the carbonyl group. Unless defined otherwise, technical and scientific terms used herein have the same meaning as is commonly understood by one of skill in the art to which this invention belongs.

As summarized above, the present disclosure provides improved electrostatic dissipative composites. The composites are generally comprised of a thermoplastic polymer matrix or phase and a plurality of carbon fibers dispersed within the polymer matrix or phase As described in more detail below, it has been unexpectedly discovered that by selection of the appropriate carbon fibers having predetermined values of tensile modulus, the disclosed composites can exhibit a relatively more robust percolation curve when compared to conventional electrostatic dissipative composites. In particular, the disclosed composites exhibit a relatively flat percolation curve enabling the manufacture of electrostatic dissipative composites with increased and wider ranges of carbon fiber loadings while still maintaining a surface resistivity in the desired range. Thus, it will be appreciated in view of this disclosure that performance of the disclosed electrostatic dissipative composites will not be significantly affected, if at all, by minor changes or fluctuations in carbon fiber loading or distribution during processing of the materials.

The disclosed composites exhibit desired levels of surface resistivity, preferably in the range of from about $10^6$ ohms to about $10^9$ ohms, including surface resistivities of about $10^7$ ohms, or about $10^8$ ohms.

The carbon fibers suitable for use in the manufacture of the disclosed composites are intermediate modulus (IM) carbon fibers having a tensile modulus in the range of from about 38 million pounds per square inch (MSI) to 48 million pounds per square inch (MSI). In contrast, conventional electrostatic dissipative composites are typically loaded with carbon fibers having a tensile modulus below 38 MSI. For example, polyacrylonitrile based standard modulus carbon fibers typically exhibit a tensile modulus value of about 29 to 35 MSI. According to further embodiments, the intermediate modulus fibers suitable for use in the manufacture of the disclosed composites have a tensile modulus in the range of from about 40 MSI to 44 MSI. In still further embodiments, an exemplary intermediate modulus carbon fiber has a tensile modulus of about 42 MSI.

As one of ordinary skill in the art will appreciate, most commercially available carbon fibers are typically produced through controlled pyrolysis of polyacrylanitrile fibers, also known as PAN fibers. When compared to the manufacture of standard modulus carbon fibers such as those described above, intermediate modulus carbon fibers are exposed to higher heat treatments during their manufacture which results in an improved alignment of the graphene layers within the fiber. This higher heat treatment can also increase the porosity in the fiber structure and thus can also result in discontinuation between the graphene layers of the fiber. Without wishing to be bound by theory, it is believed this discontinuation between the graphene layers also results in the different percolation curve behavior exhibited by the intermediate modulus carbon fibers utilized to manufacture the disclosed composites.

Non-limiting examples of commercially available intermediate modulus carbon fibers include HexTow® IM7, commercially available from the Hexcel Corporation, and having a tensile modulus of about 40 MSI and TORAYCA® T800S, commercially available from Toray Carbon Fibers America, Inc., (a wholly owned subsidiary of Toray Industries, Inc.) and having a tensile modulus of about 42 MSI.

As noted above, the disclosed composites exhibit a relatively robust percolation curve, i.e., a relatively flat percolation curve enabling the manufacture of electrostatic dissipative composites with increased and wider ranges of carbon fiber loadings while still maintaining a surface resistivity in the desired range of from about $10^6$ ohms to $10^9$ ohms. To that end, according to some embodiments of this disclosure the intermediate modulus fibers can be present in the composite in an amount of at least 8 weight percent relative to the total weight of the composite. In further embodiments, the carbon fibers can be present in an amount of at least 10 weight percent, at least 12 weight percent, at least 14 weight percent, or at least 16 weight percent. In still further embodiments, the carbon fibers can be present in the composite in an amount in the range of from 8 weight percent to 16 weight percent, including exemplary amounts of 9 weight percent, 10 weight percent, 11 weight percent, 12 weight percent, 13 weight percent, 14 weight percent, and 15 weight percent. In still a further embodiment, the carbon fiber can be present in the composite in an amount in the range of from 10 weight percent to 14 weight percent.

The intermediate modulus carbon fibers suitable for use in the disclosed composites can have any desired fiber lengths. According to some embodiments, it is desired for the intermediate modulus carbon fibers to be chopped fibers having chopped fiber lengths in the range of from about 4.0 mm to 8.0 mm. In still further embodiments, it is desired for the chopped carbon fibers to have a fiber length in the range of from 4.5 mm to 7.5 mm.

The thermoplastic resin phase or matrix can be comprised of any desired thermoplastic resin conventionally used in the manufacture of thermoplastic electrostatic dissipative composites. For example, according to some embodiments the thermoplastic resin phase can comprise a polyetherimide. In further embodiments, the thermoplastic resin phase can comprise a polycarbonate resin, a polyamide resin, a polyacetal resin, a polyphenylene sulfide resin, a polyolefin resin, a polyphthalimide resin, polyethersulfone resin, or a polyetheretherketone resin. In still further embodiments, the thermoplastic resin phase can comprise a mixture or blend of any two or more thermoplastic resins described above.

The disclosed composites may further optionally comprise one or more additives conventionally used in the manufacture of polymer resin containing electrostatic dissipative composites with the proviso that the additives do not adversely affect the desired properties of the resulting electrostatic dissipative composite. Mixtures of additives may also be used. Such additives may be mixed at a suitable time during the mixing of the components for forming the composite mixture. For example, the disclosed composites can comprise one or more fillers, stabilizers, flame-retardants, impact modifiers, colorant, and/or mold release agents.

The disclosed composites comprising the above-described components can be manufactured according to any conventionally known methods of preparing conventional carbon fiber based electrostatic dissipative composites. For example, a plurality of intermediate modulus carbon fibers and a thermoplastic polymer resin can be combined to provide a composite mixture wherein the plurality of carbon fibers are at least substantially dispersed within the thermoplastic polymer resin phase. The fibers and the resin can be combined, for example, by using conventional extrusion techniques.

Still further, the resulting composite mixture can be used to provide any desired shaped, formed, or molded articles. For example, the composite mixture may be molded into useful shaped articles by a variety of means such as injection molding, extrusion, rotational molding, blow molding and thermoforming. As noted above, the disclosed composites are particularly well suited for use in the manufacture of electronic components and devices. As such, according to some embodiments, the disclosed composites can be use to form articles such as printed circuit board carriers, burn in test sockets, flex brackets for hard disk drives, and the like.

In addition to the desired surface resistivity, the disclosed composites can also exhibit desired mechanical properties. As one of ordinary skill in the art will appreciate, intermediate modulus carbon fibers are conventionally used in the manufacture of relatively high modulus composites for use in applications where structural integrity is desired, including for example, aircraft and spacecraft components. As such, the disclosed composites according to some embodiments similarly exhibit improved mechanical properties, including for example, improved flexural modulus and improved flexural strength as measured according to the ASTM D790 testing standard, improved tensile modulus and improved tensile strength as measured according to the ASTM D638 testing standard, improved elongation percentage at break as also measured according to the ASTM D638 testing standard, and improved notched impact strength as also measured according to the ASTM D638 testing standard.

EXAMPLES

The following examples are put forth so as to provide those of ordinary skill in the art with a complete disclosure and description of how the electrostatic dissipative composites disclosed and claimed herein can be made and evaluated, and are intended to be purely exemplary and are not intended to limit the disclosure. Efforts have been made to ensure accuracy with respect to numbers (e.g., amounts, temperature, etc.), but some errors and deviations should be accounted for. Unless indicated otherwise, parts are parts by weight, temperature is in C or is at ambient temperature, and pressure is at or near atmospheric.

In the following examples, electrostatic dissipative composites of the present invention were manufactured and compared to a conventional or control series of composites for surface resistivity behavior and for various mechanical properties. More specifically, three different chopped carbon fibers were each dispersed in a polyetherimide base thermoplastic resin phase and evaluated for percolation curve behavior at 6 different weight percent carbon fiber loadings. The three different carbon fibers evaluated were as follows: (1) Sigrafil SGL C30 APS S006, having a standard tensile modulus of 35 MSI; (2) HexTow® IM7, having an intermediate tensile modulus of 40 MSI; and (3) TORAYCA® T800S, also having an intermediate tensile modulus of 42 MSI. Each carbon fiber was analyzed for its surface resistivity as characterized by its percolation curve behavior at various loading percentages of about 5 weight percent, about 6.5 weight percent, about 10 weight percent, about 12.5 weight percent, and about 15 weight percent. Table 1 below sets forth the specific composite formulations evaluated.

TORAYCA T800S carbon fibers. To that end, a number of data points are observed within the ESD range of $10^6$ ohms to $10^9$ ohms. Therefore, it can be seen that an ESD material designed with these exemplary fibers at, for example a 12 wt % loading of the carbon fiber, slight variation in carbon fiber loading during the processing (extrusion/molding) will not affect the ESD performance of the material. In other words, it is now possible to design robust ESD safe materials with these carbon fibers.

In addition to the surface resistivity analysis, formulations A4, B4, and C4 were further evaluated to show comparative mechanical properties including flexural modulus, flexural strength, tensile modulus, tensile strength, elongation percentage, and notched impact strength. Table 2 below shows the comparative properties of the 12.5 wt % carbon fiber filled PEI composites.

TABLE 2

| Test Description | Unit | C4 | B4 | A4 | Standard |
| --- | --- | --- | --- | --- | --- |
| Specific gravity | — | 1.32 | 1.32 | 1.32 | ASTM D792 |
| Flexural Modulus | MPa | 9290 | 12200 | 11100 | ASTM D790 |
| Flexural Strength | MPa | 259 | 306 | 292 | ASTM D790 |
| Tensile Modulus | MPa | 9660 | 11900 | 11040 | ASTM D638 |
| Tensile Strength | MPa | 172 | 212 | 205 | ASTM D638 |
| Elongation | % | 2.84 | 2.77 | 2.92 | ASTM D638 |
| Notched Impact | J/m | 47 | 62.8 | 63.3 | ASTM D638 |

As the data of Table 2 illustrates, the composites with the intermediate modulus carbon fibers generally exhibited significantly better mechanical properties than did the composite comprising the standard 35 MSI tensile modulus carbon fiber.

TABLE 1

| Example | A1 | A2 | A3 | A4 | A5 | B1 | B2 | B3 | B4 | B5 | C1 | C2 | C3 | C4 | C5 |
| --- | --- | --- | --- | --- | --- | --- | --- | --- | --- | --- | --- | --- | --- | --- | --- |
| Wt. % 35 MSI Fiber (C) | 0 | 0 | 0 | 0 | 0 | 0 | 0 | 0 | 0 | 0 | 5.0 | 6.5 | 10 | 12.5 | 15 |
| Wt. % 40 MSI Fiber (B) | 0 | 0 | 0 | 0 | 0 | 5.0 | 6.5 | 10 | 12.5 | 15 | 0 | 0 | 0 | 0 | 0 |
| Wt. % 42 MSI Fiber (A) | 5.0 | 6.5 | 10 | 12.5 | 15 | 0 | 0 | 0 | 0 | 0 | 0 | 0 | 0 | 0 | 0 |
| Wt. % PEI Resin | 95 | 93.5 | 90 | 87.5 | 85 | 95 | 93.5 | 90 | 87.5 | 85 | 95 | 93.5 | 90 | 87.5 | 85 |

The above formulations were compounded in a ZSK 40 mm twin screw extruder whereby the polyetherimide resin was added at the feed throat and the carbon fibers were fed downstream. The barrel temperatures ranged from 650°F to 680°F. Test parts were then injection molded with barrel temperatures set to $680^2$ F. and mold temperature set to 300° F.

Figure 2:
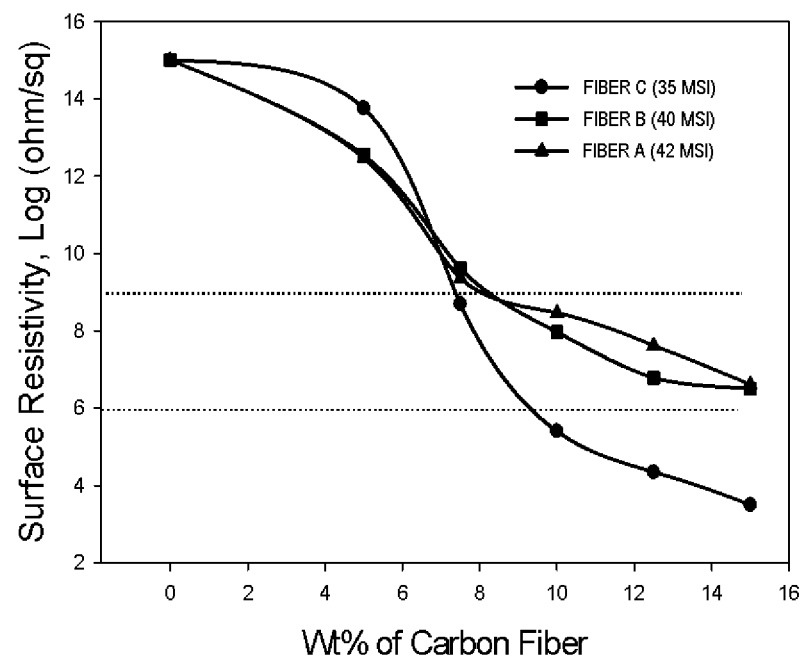
FIG. 2 is a graph illustration of surface resistivity percolation curves for several inventive and comparative composites described in the examples.

FIG. 2 shows the electrical percolation curves generated from analysis of the above-described polyetherimide composites with three different chopped carbon fibers at various loading percentages. As shown, the surface resistivity graph of the composite with the SGLC30APS 35 MSI fibers exhibits a relatively steep transition during the network formation and within the desired surface resistivity range of $10^6$ ohms to $10^9$ ohms. However, in contrast, relatively flat transition behavior within the desired surface resistivity range of $10^6$ ohms to $10^9$ ohms is observed with the HexTow IM7 and the

What is claimed is:
1. An electrostatic dissipative composite, comprising
   a) a thermoplastic polymer matrix; and
   b) a plurality of carbon fibers having a tensile modulus in the range of from 38 to 48 million pounds per square inch (MSI) dispersed within the thermoplastic polymer matrix;
      wherein the composite exhibits a surface resistivity in the range of from $10^6$ ohms to $10^9$ ohms.
2. The composite of claim 1, wherein the plurality of carbon fibers are present in the thermoplastic matrix in an amount greater than about 8 weight percent relative to a total weight of the composite.
3. The composite of claim 1, wherein the plurality of carbon fibers are present in the thermoplastic matrix in an amount in the range of from about 8 weight percent to about 16 weight percent relative to a total weight of the composite.

4. The composite of claim 1, wherein the plurality of carbon fibers are present in the thermoplastic matrix in an amount in the range of from about 10 weight percent to about 14 weight percent relative to a total weight of the composite.

5. The composite of claim 1, wherein the plurality of carbon fibers have a tensile modulus in the range of from about 40 to 42 million pounds per square inch (MSI).

6. The composite of claim 1, wherein the thermoplastic polymer matrix comprises a polyetherimide.

7. The composite of claim 1, wherein the thermoplastic polymer matrix comprises at least one polymer selected from the group consisting of polycarbonate, polyamide, polyacetal, polyphenylene sulfide, and polyetheretherketone.

8. An electrostatic dissipative composite, comprising
a) a thermoplastic polymer matrix; and
b) a plurality of carbon fibers having a tensile modulus in the range of from 39 to 43 million pounds per square inch (MSI) dispersed within the thermoplastic polymer matrix;
wherein the plurality of carbon fibers are present in the thermoplastic matrix in an amount in the range of from about 8 weight percent to about 16 weight percent relative to a total weight of the composite; and
wherein the composite exhibits a surface resistivity in the range of from $10^6$ ohms to $10^9$ ohms.

9. The composite of claim 8, wherein the plurality of carbon fibers are present in the thermoplastic matrix in an amount in the range of from about 10 weight percent to about 14 weight percent relative to a total weight of the composite.

10. The composite of claim 8, wherein the plurality of carbon fibers have a tensile modulus in the range of from about 40 to 42 million pounds per square inch (MSI).

11. The composite of claim 8, wherein the thermoplastic polymer matrix comprises a polyetherimide.

12. The composite of claim 8, wherein the thermoplastic polymer matrix comprises at least one polymer selected from the group consisting of polycarbonate, polyamide, polyacetal, polyphenylene sulfide, and polyetheretherketone.

13. A method for the manufacture of an electrostatic dissipative composite, comprising the steps of:
a) providing a thermoplastic resin;
b) providing a plurality of carbon fibers having a tensile modulus in the range of from 38 to 48 million pounds per square inch (MSI);
c) combining the plurality of carbon fibers and the thermoplastic resin to provide a composite mixture wherein the plurality of carbon fibers are present in the mixture in an amount in the range of from about 8 weight percent to about 16 weight percent relative to a total weight of the mixture; and
d) forming a molded part from the composite mixture wherein the molded part has a surface resistivity in the range of from $10^6$ ohms to $10^9$ ohms.

14. The method of claim 13, wherein the plurality of carbon fibers are present in the thermoplastic matrix in an amount in the range of from about 10 weight percent to about 14 weight percent relative to a total weight of the composite.

15. The method of claim 13, wherein the plurality of carbon fibers have a tensile modulus in the range of from about 40 to 42 million pounds per square inch (MSI).

16. A method for the manufacture of an electrostatic dissipative composite, comprising the steps of:
a) providing a thermoplastic resin;
b) providing a plurality of carbon fibers having a tensile modulus in the range of from 38 to 48 million pounds per square inch (MSI); and
c) combining the plurality of carbon fibers and the thermoplastic resin to provide a composite mixture wherein the plurality of carbon fibers are present in the mixture in an amount in the range of from about 8 weight percent to about 16 weight percent relative to a total weight of the mixture,
wherein the thermoplastic resin comprises a polyetherimide.

17. The method of claim 13, wherein the thermoplastic resin comprises at least one polymer selected from the group consisting of polycarbonate, polyamide, polyacetal, polyphenylene sulfide, and polyetheretherketone.

18. The method of claim 13, wherein the combining of step c) is performed by extrusion.

19. A method for the manufacture of an electrostatic dissipative composite, comprising the steps of:
a) providing a thermoplastic resin;
b) providing a plurality of carbon fibers having a tensile modulus in the range of from 38 to 48 million pounds per square inch (MSI);
c) combining the plurality of carbon fibers and the thermoplastic resin to provide a composite mixture wherein the plurality of carbon fibers are present in the mixture in an amount in the range of from about 8 weight percent to about 16 weight percent relative to a total weight of the mixture, and
d) forming a molded part from the composite mixture, wherein the molded part has a surface resistivity in the range of from $10^6$ ohms to $10^9$ ohms, and the molded part is formed by injection molding.

20. An electrostatic dissipative composite, comprising
a) a thermoplastic polymer matrix comprising a polyetherimide; and
b) a plurality of carbon fibers having a tensile modulus in the range of from 38 to 48 million pounds per square inch (MSI) dispersed within the thermoplastic polymer matrix;
wherein the composite exhibits a surface resistivity in the range of from $10^6$ ohms to $10^9$ ohms.

21. The composite of claim 20, wherein the plurality of carbon fibers are present in the thermoplastic matrix in an amount greater than about 8 weight percent relative to a total weight of the composite.

22. The composite of claim 20, wherein the plurality of carbon fibers are present in the thermoplastic matrix in an amount in the range of from about 8 weight percent to about 16 weight percent relative to a total weight of the composite.

23. The composite of claim 20, wherein the plurality of carbon fibers are present in the thermoplastic matrix in an amount in the range of from about 10 weight percent to about 14 weight percent relative to a total weight of the composite.

24. The composite of claim 20, wherein the plurality of carbon fibers have a tensile modulus in the range of from about 40 to 42 million pounds per square inch (MSI).

25. An electrostatic dissipative composite, comprising
a) a thermoplastic polymer matrix comprising a polyetherimide; and
b) a plurality of carbon fibers having a tensile modulus in the range of from 39 to 43 million pounds per square inch (MSI) dispersed within the thermoplastic polymer matrix;
wherein the plurality of carbon fibers are present in the thermoplastic matrix in an amount in the range of from about 8 weight percent to about 16 weight percent relative to a total weight of the composite; and
wherein the composite exhibits a surface resistivity in the range of from $10^6$ ohms to $10^9$ ohms.

26. The composite of claim 25, wherein the plurality of carbon fibers are present in the thermoplastic matrix in an amount in the range of from about 10 weight percent to about 14 weight percent relative to a total weight of the composite.

27. The composite of claim 25, wherein the plurality of carbon fibers have a tensile modulus in the range of from about 40 to 42 million pounds per square inch (MSI).

28. A method for the manufacture of an electrostatic dissipative composite, comprising the steps of:
 a) providing a thermoplastic resin comprising a polyetherimide;
 b) providing a plurality of carbon fibers having a tensile modulus in the range of from 38 to 48 million pounds per square inch (MSI); and
 c) combining the plurality of carbon fibers and the thermoplastic resin to provide a composite mixture wherein the plurality of carbon fibers are present in the mixture in an amount in the range of from about 8 weight percent to about 16 weight percent relative to a total weight of the mixture.

29. The method of claim 28, further comprising forming a molded part from the composite mixture and wherein the molded part has a surface resistivity in the range of from $10^6$ ohms to $10^9$ ohms.

30. The method of claim 28, wherein the plurality of carbon fibers are present in the thermoplastic matrix in an amount in the range of from about 10 weight percent to about 14 weight percent relative to a total weight of the composite.

31. The method of claim 28, wherein the plurality of carbon fibers have a tensile modulus in the range of from about 40 to 42 million pounds per square inch (MSI).

32. The method of claim 28, wherein the combining of step c) is performed by extrusion.

33. The method of claim 32, wherein the molded part is formed by injection molding.

* * * * *